(12) United States Patent
Kim

(10) Patent No.: US 8,357,578 B2
(45) Date of Patent: Jan. 22, 2013

(54) SEMICONDUCTOR DEVICE AND METHOD FOR MANUFACTURING THE SAME

(75) Inventor: Ji Hyung Kim, Seoul (KR)

(73) Assignee: Hynix Semiconductor Inc., Icheon (KR)

(*) Notice: Subject to any disclaimer, the term of this patent is extended or adjusted under 35 U.S.C. 154(b) by 490 days.

(21) Appl. No.: 12/643,861

(22) Filed: Dec. 21, 2009

(65) Prior Publication Data

US 2011/0049619 A1   Mar. 3, 2011

(30) Foreign Application Priority Data

Aug. 28, 2009  (KR) .................. 10-2009-0080566

(51) Int. Cl.
*H01L 21/336* (2006.01)
*H01L 27/088* (2006.01)

(52) U.S. Cl. ....................... 438/284; 257/392
(58) Field of Classification Search .................. 257/301, 257/365, 392, 621, E27.084, E21.209; 438/259, 438/284
See application file for complete search history.

(56) References Cited

U.S. PATENT DOCUMENTS

| | | | | |
|---|---|---|---|---|
| 7,368,348 | B2 * | 5/2008 | Lee | 438/259 |
| 7,719,056 | B2 * | 5/2010 | Hamamoto | 257/347 |
| 8,058,687 | B2 * | 11/2011 | Tai et al. | 257/332 |
| 2004/0063286 | A1 | 4/2004 | Kim et al. | |
| 2008/0179668 | A1 | 7/2008 | Tai et al. | |

FOREIGN PATENT DOCUMENTS

KR   1020060054667 A   5/2006

* cited by examiner

*Primary Examiner* — Calvin Lee

(57) ABSTRACT

A semiconductor device and a method for manufacturing the same are disclosed. The method for manufacturing the semiconductor device forms a recess gate region on a semiconductor substrate, forms an isolation layer isolated from the recess gate region using a high-temperature thermal process, and guarantees a larger channel region by filling the isolation layer with a gate electrode material, so that a cell current is increased and on/off characteristics of a transistor are improved.

9 Claims, 4 Drawing Sheets

SEMICONDUCTOR DEVICE AND METHOD FOR MANUFACTURING THE SAME

CROSS-REFERENCE TO RELATED APPLICATION

The priority of Korean patent application No. 10-2009-0080566 filed on Aug. 28, 2009, the disclosure of which is hereby incorporated in its entirety by reference, is claimed.

BACKGROUND OF THE INVENTION

The present invention relates to a semiconductor device and a method for manufacturing the same, which form a recess gate region on a semiconductor substrate, form an isolation layer isolated from the recess gate region using a high-temperature thermal process, and guarantee a larger channel region by filling the isolation layer with a gate electrode material, so that a cell current is increased and on/off characteristics of a transistor are improved.

An important parameter among a plurality of parameter requisites for a process for manufacturing a transistor of a semiconductor device is a threshold voltage (Vt). The threshold voltage is a variable that depends on a thickness of a gate oxide layer, a channel doping density, an oxide charge, and a material used for a gate. The smaller the size of a device, the larger a difference between the threshold voltage and a theoretical threshold value. In more detail, there arises a variety of problems in which the threshold voltage is not identical to a theoretical threshold value as the size of a semiconductor device is gradually decreased. An example of such a problem is a short channel effect that is generated as a gate channel length is decreased.

As the semiconductor device becomes highly integrated, a nano (nm)-sized device requires not only an increase in speed but also a capability of operating at a low voltage of 1V~2V, and thus requires a low threshold voltage. However, if the threshold value is further decreased, it is impossible to control the device due to the short channel effect. In addition, the short channel effect can cause a Drain Induced Built-in Leakage (DIBL) caused by a hot carrier.

Although a variety of research are being conducted to reduce the short channel effect, a solution capable of reducing the short channel effect remains unfinished as the semiconductor device continues to become highly integrated.

Although there is research aimed to find out the solution by adjusting the doping density, these methods do not completely solve the short channel effect. A variety of these research methods are well known to those skilled in the art. For example, a method for forming a Super Steep Retrograde Channel (SSR) through a Vertically Abrupt Channel Doping (VACD), a method for forming an ion implant channel, a Laterally Abrupt Channel Doping (LACD) method, a method for forming a channel including a halo structure through a Large Angle Tilt Implant (LATI), etc. may be used.

However, the reduction in thickness of a gate oxide layer and the reduction in short channel effect are basically limited. In recent times, in order to obviate the above-mentioned limitations, a channel length is guaranteed using a recess gate, and a degree of freedom of a cell junction is increased, and a channel width is increased using a fin-gate technology, such that a cell current is guaranteed and a leakage current is adjusted.

However, the above-mentioned technology that uses the recess gate and the fin gate technology may have a certain disadvantage for a device with a cell size of 30 nm or less.

BRIEF SUMMARY OF THE INVENTION

Various embodiments of the present invention are directed to providing a semiconductor device and a method for manufacturing the same that substantially obviate one or more problems due to limitations and disadvantages of the related art.

In accordance with an aspect of the present invention, a method for manufacturing a semiconductor device includes forming a recess region in a semiconductor substrate, forming an isolation layer isolated from the recess region by performing an annealing process, and forming a gate electrode layer in the recess region and the isolation layer.

Preferably, the recess region may be etched to a depth of 1300 Å~2500 Å.

Preferably, the annealing process may be performed at a temperature range of 750° C. to 950° C. in a $H_2$ environment.

Preferably, the method may further include adjusting a processing time of the annealing process in response to a temperature.

Preferably, the method may further include, after forming the recess region, performing a cleaning process using a hydro-fluoric (HF) material.

Preferably, the method may further include, after performing the annealing process, additionally performing the annealing process at a temperature range of 750° C. to 950° C. in a $H_2$ environment.

Preferably, the isolation layer may be formed under the recess region.

Preferably, the isolation layer may be configured in a form of a tunnel.

In accordance with another aspect of the present invention, a semiconductor device includes a recess region configured to be formed in a semiconductor substrate, an isolation layer configured to be isolated from the recess region through an annealing process, and a gate electrode layer configured to be buried in the recess region and the isolation layer.

Preferably, the annealing process may be performed at a temperature range of 750° C. to 950° C. in a $H_2$ environment.

Preferably, a processing time of the annealing process may be adjusted with temperature.

Preferably, the recess region may be etched to a depth of 1300 Å~2500 Å.

Preferably, the isolation layer may be formed under the recess region.

Preferably, the isolation layer may be configured in a form of a tunnel.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
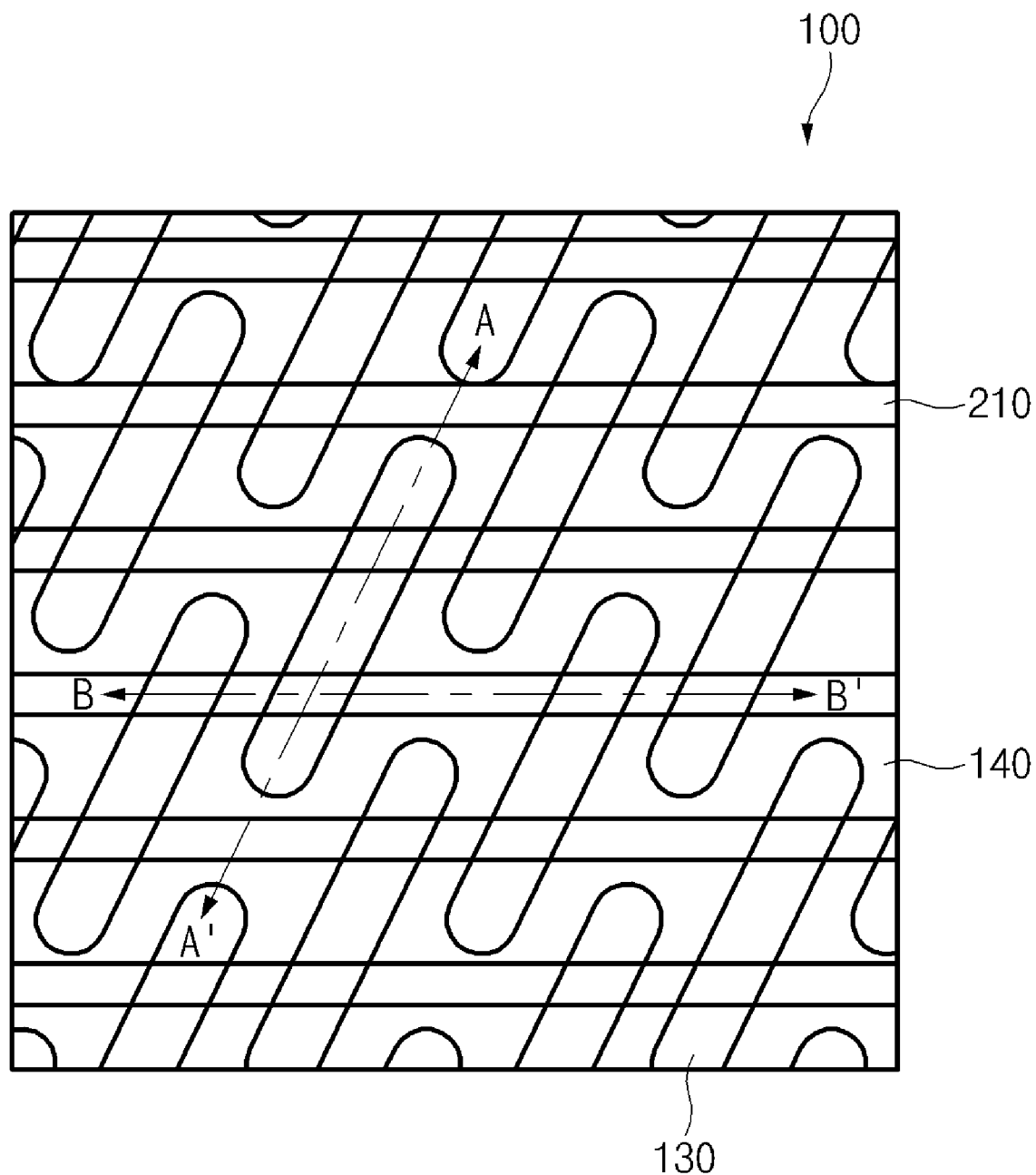
FIG. 1 is a plan view illustrating a method for manufacturing a semiconductor device according to embodiments of the present invention.

FIG. 1 is a plan view illustrating a method for manufacturing a semiconductor device according to embodiments of the present invention.

Referring to FIG. 1, a plurality of active regions 130, each of which is configured in a form of a 6F2-shaped bar and is arranged in a form of an oblique-directional island on a semiconductor substrate 100, and a device isolation layer 140 is formed between the active regions 130.

A recess gate 210 crossing the active region 130 at a predetermined angle is formed.

The active region 130 and the device isolation layer 140 are etched when the recess gate 210 is formed, such that a recess region (See '150' shown in FIG. 2A) is formed. A high-temperature annealing process is performed in the recess region (See '150' shown in FIG. 2A), so that an isolation layer (See '170' shown in FIG. 2B) isolated from the recess region (See '150' shown in FIG. 2A) is formed. Thereafter, a gate electrode layer is buried in the isolation layer (See '170' shown in FIG. 2B), so that a peripheral region of the isolation layer (See '170' shown in FIG. 2B) can be used as a channel. Since the peripheral region of the isolation layer (See '170' shown in FIG. 2B) can be used as a channel, gate controllability is improved.

Figure 2A:
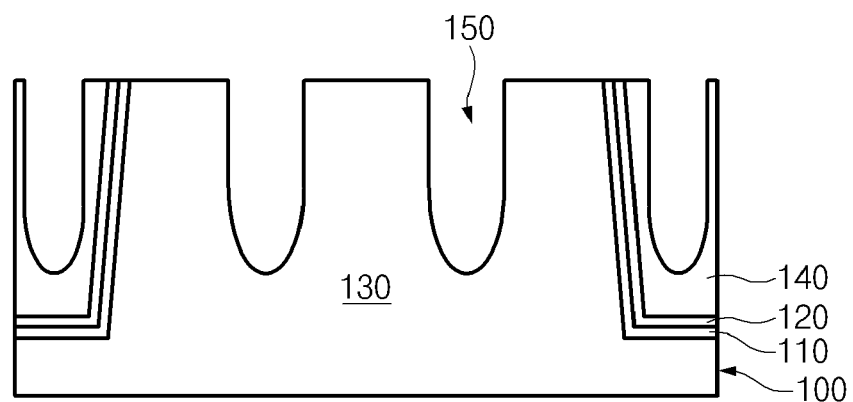
FIGS. 2A to 2C are cross-sectional views illustrating a method for manufacturing a semiconductor device according to embodiments of the present invention.
Figure 2B:
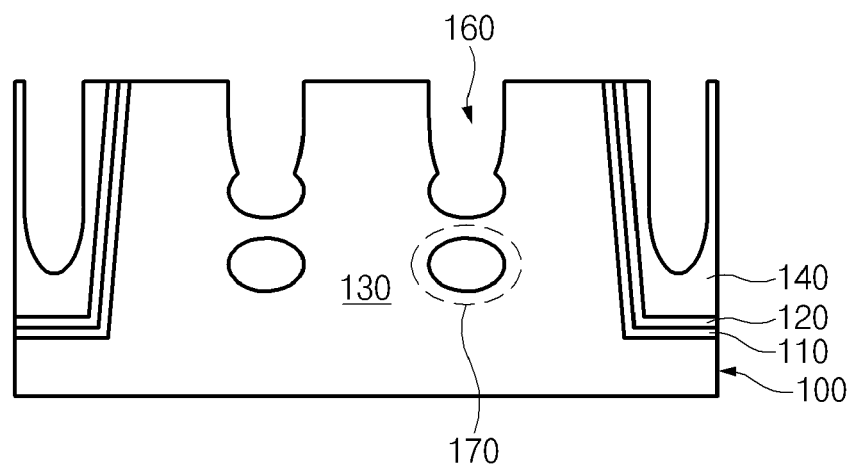
Figure 2C:
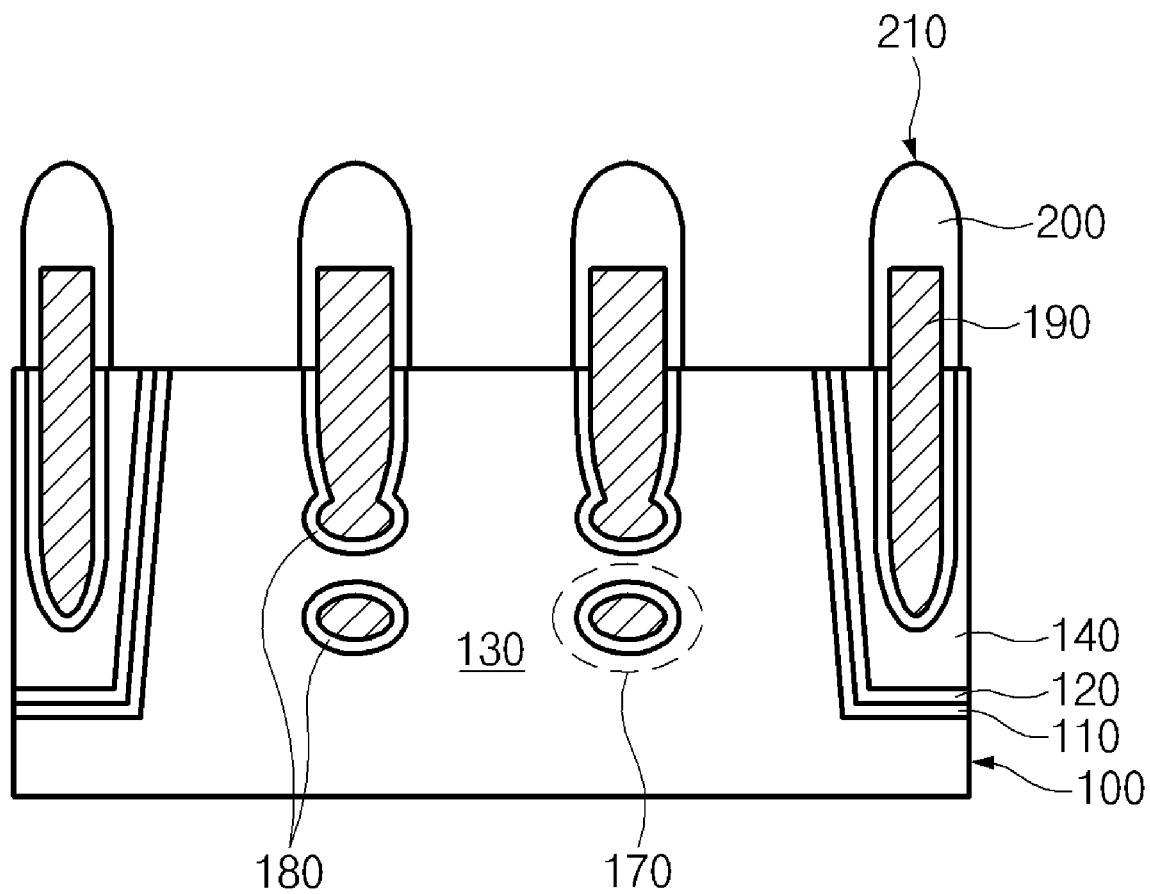

FIGS. 2A to 2C are cross-sectional views illustrating a method for manufacturing a semiconductor device according to embodiments of the present invention. In more detail, FIGS. 2A to 2C are cross-sectional views illustrating the semiconductor device taken along the line A-A' of FIG. 1.

Referring to FIG. 2A, a trench (not shown) is formed by etching a semiconductor substrate 100, and a pad oxide layer 110 and a pad nitride layer 120 are deposited on the entire surface of the semiconductor substrate 100 including the trench. Thereafter, an insulating layer (not shown) is formed on the pad nitride layer 120.

The insulating layer (not shown), the pad nitride layer 120, and the pad oxide layer 110 are removed using a Chemical Mechanical Polishing (CMP) process until the semiconductor substrate 100 is exposed, such that a device isolation layer 140 for defining the active region 130 is formed.

Next, after a photoresist layer is formed on the entire surface including not only the active region 130 but also the device isolation layer 140, a photoresist pattern (not shown) is formed by an exposure and development process using a recess gate mask. The active region 130 and the device isolation layer 140 are etched using the photoresist pattern as a mask, so that a recess region 150 is formed. In this case, the recess region 150 is etched to a depth deeper than that of a recess region of the related art. The recess region 150 can be etched to a depth of 1300 Å~2500 Å.

Subsequently, in a post-process, a cleaning process utilizing a hydrofluoric (HF) based material is performed on the entire surface including the recess region 150, such that silicon (Si) can be separated. A cleaning process for removing the remaining oxide layer from an upper part of the recess region 150 is performed. In addition, due to the execution of the cleaning process, the silicon (Si) separation process can be carried out at a low temperature of 750° C. in a post-process. In other words, in a subsequent thermal process, if the thermal process is performed at a high temperature of 950° C. or higher for a long period of time, the surface of the silicon (Si) and the surface of the oxide layer are affected, resulting in the occurrence of a poor surface profile.

Referring to FIG. 2B, a $H_2$ annealing process 160 is executed on the entire surface including the recess region 150, so that an isolation layer 170 isolated from the top portion of the recess region 150 is formed. At this time, the annealing process 160 may be executed at a temperature range of 750° C. to 950° C. in a $H_2$ environment, and the annealing processing time may be adjusted in response to the above-mentioned temperature range. In this case, the isolation layer 170 is formed from the bottom portion of the recess region 150, and is configured in a form of a tunnel. That is, the isolation layer 170 defines a hollow space. In one embodiment, the active region 130 is made of silicon and the annealing process grows the silicon define the tunnel.

Next, a higher-density $H_2$ annealing process is additionally executed on the entire surface including not only the recess region 150 but also the isolation layer 170, so that the number of dangling bonds between silicon materials is reduced. At this time, the higher-density $H_2$ annealing process may be additionally executed in the temperature range of 750° C. to 950° C.

Referring to FIG. 2C, after a channel ion implantation process is performed in the active region 130, a gate oxide layer 180 is deposited on the entire surface including not only the recess region 150 but also the isolation region 170 through a gate oxidation process. Thereafter, a patterning process is performed in a manner that the gate oxide layer 180 remains in only the recess gate 150 and the isolation region 170.

Next, a gate electrode layer 190 and a gate hard mask layer 200 are deposited on the entire surface including the gate oxide layer 180. In this case, the gate oxide layer 180 and the gate electrode layer 190 are buried in the isolation layer 170, so that a peripheral region of the isolation layer 170 can be used as a channel. Since the peripheral region of the isolation layer 170 can be used as a channel, the gate controllability is improved.

Thereafter, the gate hard mask layer 200 and the gate electrode layer 190 are etched using a recess gate etching mask until the semiconductor substrate 100 is exposed, such that a recess gate is completed.

Figure 3:
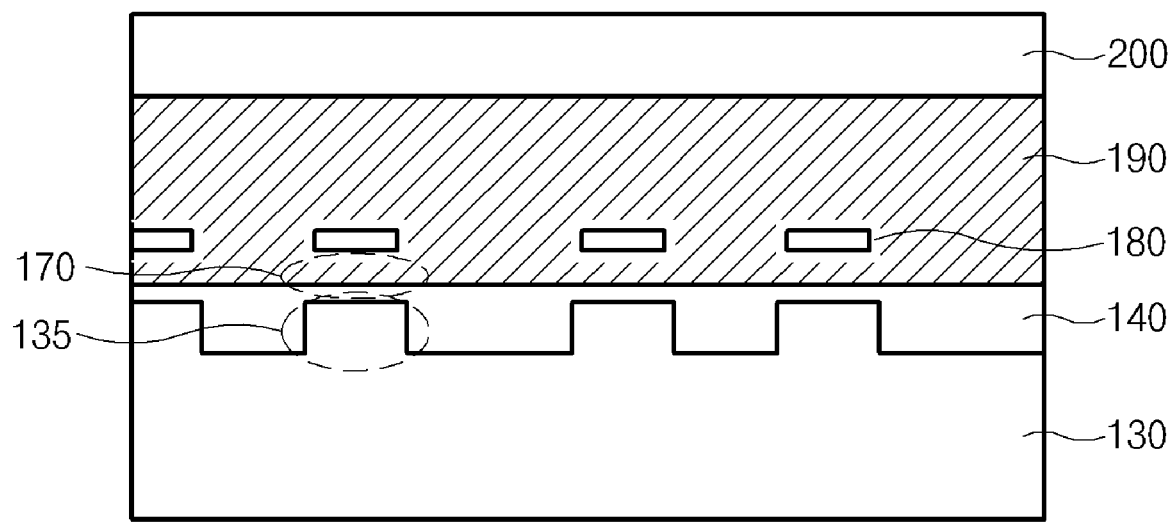
FIG. 3 is a cross-sectional view illustrating a method for manufacturing a semiconductor device according to embodiments of the present invention.

FIG. 3 is a cross-sectional view illustrating a method for manufacturing a semiconductor device according to embodiments of the present invention. In more detail, FIG. 3 is a cross-sectional view illustrating the semiconductor device taken along the line B-B' of FIG. 1.

Referring to FIG. 3, a fin-type active region 135 and an isolation layer 170 are formed on a semiconductor substrate. The isolation layer 170 is enclosed with a gate metal layer 190. Since a peripheral region of the isolation layer 170 can be used as a channel, the gate controllability is improved.

As apparent from the above description, the semiconductor device and the method for manufacturing the same according to embodiments of the present invention form a recess gate region on a semiconductor substrate, form an isolation layer isolated from the recess gate region using a high-temperature thermal process, and guarantee a larger channel region by filling the isolation layer with a gate electrode material, so that a cell current is increased and on/off characteristics of a transistor are improved.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:

forming a recess region in a semiconductor substrate, the recess region having a lower region and an upper region;

annealing the semiconductor substrate to grow material and form a tunnel at the lower region of the recess region, the tunnel being separated from the upper region of the recess region by the material grown, the annealing being performed at a temperature range of 750° C. to 950° C. in a $H_2$ environment; adjusting a processing time of the annealing process in response to a temperature; and forming a gate electrode layer within the recess region and the tunnel.

2. The method according to claim 1, wherein the recess region is etched to a depth of 1300 Å~2500 Å.

3. The method according to claim 1, further comprising:

performing a cleaning process on the recess region using a hydro-fluoric (HF) material.

4. The method according to claim 1, further comprising:

after forming the tunnel, performing another annealing process at a temperature range of 750° C. to 950° C. in a $H_2$ environment.

5. The method according to claim 1, further comprising forming a gate dielectric layer conformally within the recess region and the tunnel.

6. A semiconductor device comprising:

a semiconductor substrate comprising a semiconductor material;

a recess region formed in the semiconductor substrate;

an isolation region provided directly below the recess region and being separated from the recess region by the semiconductor material, the isolation region having been formed using an annealing process performed at a temperature range of 750° C. to 950° C. in a $H_2$ environment; a processing time of the annealing process is adjusted with a temperature; and a gate electrode layer filling the recess region and the isolation region.

7. The semiconductor device according to claim 6, wherein the recess region is formed from a trench having a depth of 1300 Å~2500 Å.

8. The semiconductor device according to claim 6, wherein the gate electrode layer filling the recess region and the isolation region is a unitary structure.

9. The semiconductor device according to claim 6, wherein the isolation region resembles a tunnel.

* * * * *